(12) United States Patent
Chung (10) Patent No.: US 6,341,806 B1
(45) Date of Patent: Jan. 29, 2002

(54) ORNAMENT CAP FOR CASINGS

(75) Inventor: Wen-Lon Chung, Taipei (TW)

(73) Assignee: Acer Peripherals, Inc. (TW)

( * ) Notice: Subject to any disclaimer, the term of this patent is extended or adjusted under 35 U.S.C. 154(b) by 0 days.

(21) Appl. No.: 09/532,960

(22) Filed: Mar. 22, 2000

(30) Foreign Application Priority Data

Apr. 6, 1999 (TW) ...................................... 88205204 U (51) Int. Cl.⁷ ............................................. E05C 19/10
(52) U.S. Cl. ........................ 292/120; 292/24; 348/839
(58) Field of Search ................................ 361/658, 654; 13/113 R, 113 MP; 348/836, 839; 312/223.2; 292/DIG. 2, 120, 31, 8, 24, 116, 101, 302; 411/372.5, 372.6, 373, 377

(56) References Cited

U.S. PATENT DOCUMENTS

| | | | |
|---|---|---|---|
| 891,818 A | * 6/1908 | Covert | 292/116 |
| 4,314,719 A | * 2/1982 | Hawkins | 292/252 |
| 5,838,534 A | * 11/1998 | Yang | 361/600 |
| 5,913,649 A | * 6/1999 | Tomimatsu et al. | 411/373 |
| RE36,695 E | * 5/2000 | Holt | 312/265.5 |

* cited by examiner

*Primary Examiner*—Robert J. Oberleitner
*Assistant Examiner*—Devon Kramer
(74) *Attorney, Agent, or Firm*—Troxell Law Offices PLLC (57) ABSTRACT

An ornament cap for covering a groove formed in a first casing which is fastened to a second casing by means of a fastening device accommodated in the groove, the cap includes a seat formed in the groove and an insert for engaging with the seat. At the engaging interface of the insert and the seat, a vertical limiting means is provided to form a vertical limiting position for preventing the insert from vertically separating from the groove after engagement, and a horizontal limiting means is provided to form a horizontal limiting position for preventing the insert from separating from the groove horizontally along the groove. There are a first stable state defining a separated state between the insert and the seat and a second stable state for engaged state between the insert and the seat. The horizontal limiting means may jump from the first stable state to the second stable state under an external force is applied to the horizontal limiting means to complete the engagement of the insert and the seat. Under another external force and a transverse force, the horizontal limiting means may jump from the second stable state to the first stable state for separating the vertical limiting means to disengage the insert from the seat.

18 Claims, 9 Drawing Sheets

ORNAMENT CAP FOR CASINGS

BACKGROUND OF THE INVENTION

1. Field of the Invention

This invention relates to an ornament cap for casings, and more particularly, to an ornament cap for covering a designed groove formed in plastic casings such as computer display units.

2. Background of the Invention

Plastic casings for computer display units and the like are usually fastened together by means of latching or screwing. The latching method is usually used for small-size or light-weight casings. It generally makes use of a keyway, a snap hook, a latch pin and the like to fasten the casings together. On the other hand, for large-size or heavy-load casing devices, it is more reliable and preferable to fasten the plastic casings by screws or bolts. In order to accommodate the screws, a transverse screw groove is usually provided in the casing at the fastening area.

Figure 1:
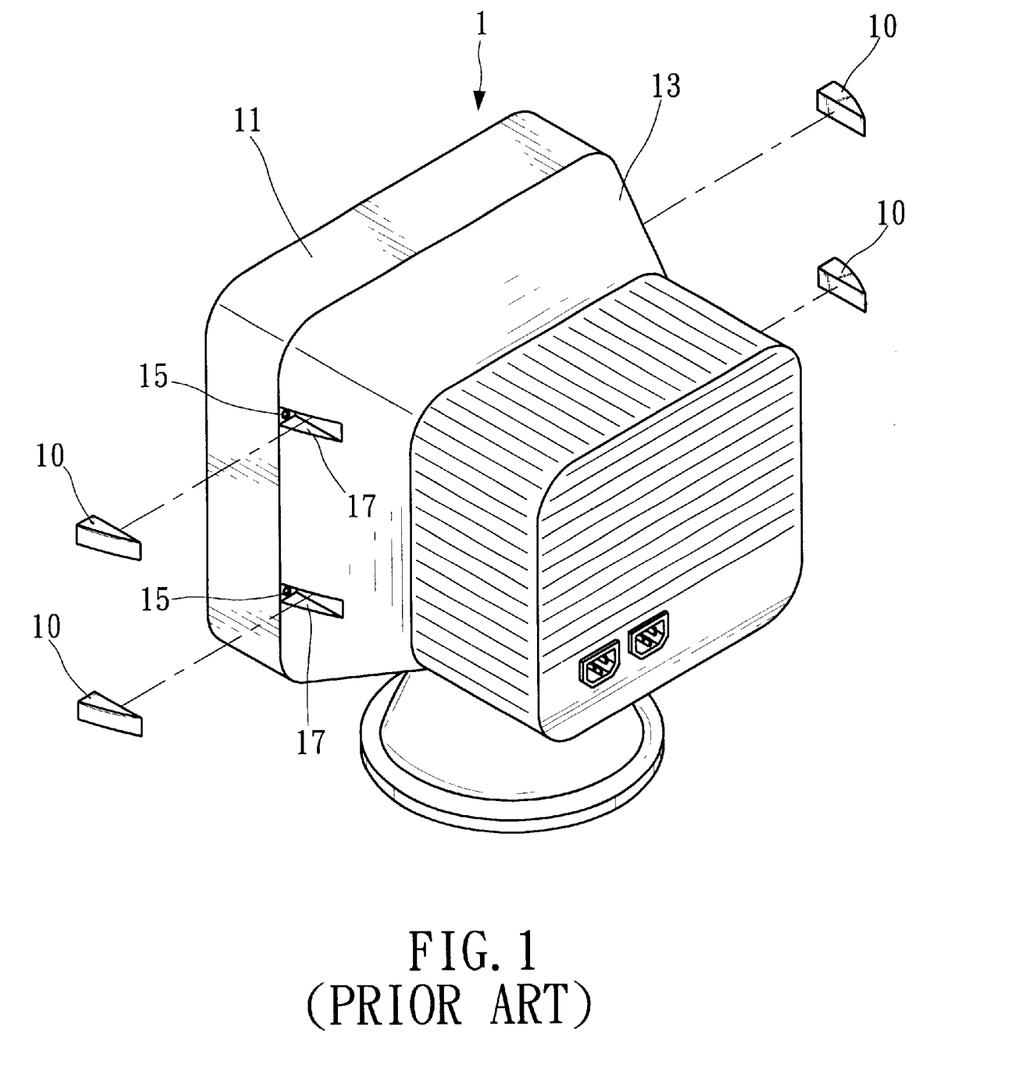
FIG. 1 is a schematic diagram of a conventional ornament cap for a computer display device.

FIG. 1 shows a typical conventional fastening means for a computer display unit 1. The display unit 1 comprises a second casing 11 and a mating first casing 13 fastened together by means of a plurality of screws 15. In the first casing 13, there are a couple of wedge-shape grooves 17 for accommodating the screws 15 to transversely fasten the second casing 11. However, the wedge-shape grooves 17 on the first casing 13 are generally not artistic in appearance. Therefore, it is preferable to use ornament caps 10 to cover the wedge-shape grooves 17 and make the casing look smoother and more beautiful.

However, the ornament caps 10 according to the conventional art have no other functions than covering the grooves 17. Moreover, if the ornament caps 10 are held in the wedge-shape grooves 17 too tightly, the ornament caps 10 will be difficult to be released from the grooves 17 or easily be damaged by prizing when it is necessary to separate the second casing 11 from the first casing 13 (while interior repair is needed). On the other hand, if the ornament caps 10 are held in the wedge-shape grooves 17 too loosely, they will drop off from the grooves easily and lose their function.

SUMMARY OF THE INVENTION

The main object of the present invention is to provide an ornament cap for smoothing out the fastening grooves in the casings, particularly to the grooves for fastening two casings by means of screws.

It is another object of the present invention to provide a reliable fastening ornament cap that has a horizontal limiting means and a vertical limiting means for restricting positions in two separating directions of the cap so that the ornament cap may be securely held in the casing.

The ornament cap according to the present invention is used for covering a screw groove formed in a first casing which is fastened with a second casing by means of a transverse screw accommodated in the screw groove. The ornament cap includes a seat fixedly located in the screw groove and an insert to be engaged with the seat and to cover the screw groove. At the engaging interface between the insert and the seat, a horizontal limiting means and a vertical limiting means are provided.

The vertical limiting means has a limiting structure for preventing the insert from loosing away from the screw groove in a direction perpendicular to the first casing wall after the insert has been engaged with the seat.

The horizontal limiting means is for preventing the insert from separating from the screw groove in a direction parallel to the first casing wall after the insert has been engaged with the seat. The horizontal limiting means includes two elastic stability states. The first stability state defines the separation condition between the insert and the seat. The second stability state defines the engaging condition between the insert and the seat.

According to the present invention, when the insert is under the engaging operation with the seat and at the time the vertical limiting means forms a limiting position, the horizontal limiting means will jump from the first stability state to the second stability state to complete the engaging operation. On the other hand, when the insert is being separated from the seat, a force is firstly applied to the horizontal limiting means to make the horizontal limiting means switch from the second stability state to the first stability state. Thereafter, another transverse force is applied to make the vertical limiting means be separated so that the insert is separated from the seat.

In an embodiment of the present invention, the vertical limiting means may include a plurality of foot holes and the mating latch legs. The foot holes are through holes formed in the seat with selected length and width. The latch legs are located on the insert for engaging with the foot holes when the engaging operation of the insert and the seat takes place. Each latch leg further has a transverse foot for engaging with the first casing wall adjacent to the foot hole when the insert is being engaged with the seat to form a vertical limiting position for preventing the ornament cap from separating with the casing vertically.

In another embodiment of the present invention, the vertical limiting means may include a plurality of foot holes and the mating latch legs. The foot holes are through holes located in the insert with selected length and width, and connect to a passage extending in a direction opposite to the second casing. The latch legs are located in the seat and each leg has a foot extending in a direction opposite to the second casing for engaging with the passage through the foot hole to form a vertical limiting position.

In a further embodiment of the present invention, the screw groove may include at least one side wall and the insert includes a side wing mating with the side wall. The vertical limiting means may include at least one bump formed on the side wall and parallel to the lateral side of the first casing, and one bulged spot located on the side wing mating with the bump. The vertical limiting means is under engaging state when the bump is positioned between the first casing and the mating bulged spot. The vertical limiting means is under separating state when the bulged spot is positioned between the first casing and the mating bump.

In yet another embodiment of the present invention, the screw groove may include at least one side wall and the insert includes a side wing mating with the side wall. The vertical limiting means may include at least one bulged spot formed on the side wall and parallel to lateral side of the first casing, and a bump located on the side wing mating with the bulged spot. The vertical limiting means is under engaging state when the bump is positioned between the first casing and the mating bulged spot. The vertical limiting means is under separating state when the bulged spot is positioned between the first casing and the mating bump.

In an embodiment of the present invention, the horizontal limiting means may include at least one elastic latching member and a mating stopping arm. The elastic latching member, for example an elastic plate, is located in the seat and formed on a first casing wall in a cantilever manner which has a free end facing the second casing and a stopping nose facing the insert. The stopping arm is located in the insert to form a horizontal limiting position with the elastic latching member when the insert has been engaged with the seat. In other word, the stopping arm is located on the far side of the stopping nose from the second casing before the insert being engaged with the seat (first stable state). After the insert engages with the seat (second stable state), the stopping arm is located at another side of the stopping nose, i.e., near the second casing. When the stopping arm passes over the stopping nose, the stopping arm will press the stopping nose and store elastic potential energy in the elastic latching member. In a preferred embodiment, the stopping nose is wedge-shaped with a sloped surface facing the opposite side of the second casing.

In another embodiment of the present invention, the horizontal limiting means may include at least one elastic latching member and a mating stopping arm. The elastic latching member is a cantilever type elastic member extending horizontally from the bottom of the screw groove toward the second casing. It has a free end upon which a stopping nose facing the insert is located. The stopping arm is located in the insert to form a horizontal limiting position with the elastic latching member when the insert has been engaged with the seat. The stopping arm is located on the far side of the stopping nose from the second casing before the insert being engaged with the seat (first stable state). After the insert engages with the seat (second stable state), the stopping arm is located at another side of the stopping nose facing the second casing. According to a preferred embodiment, the stopping nose is wedge-shaped with a sloped surface facing the opposite side of the second casing.

In yet another embodiment of the present invention, the horizontal limiting means may include an elastic arm extending toward the second casing and a mating latch hole located in the first casing. The elastic arm has a stopping hook located at one end for engaging with the latch hole under an external force. When the insert and the seat are engaged, the elastic arm and the stopping hook return to original positions. It is under the second stable state.

In a further embodiment of the present invention, the horizontal limiting means may include at least one bump located on the seat and perpendicular to a first casing wall, and a mating bulged spot located on the insert. When the bump is positioned between the second casing and the mating bulged spot, the horizontal limiting means is under separation state (the first stable state). When the bulged spot is positioned between the second casing and the mating bump, the horizontal limiting means is under engaging state (the second stable state).

In still another embodiment of the present invention, the horizontal limiting means may include at least on bump located in the insert normal to a first casing wall, and a mating bulged spot located on the seat. When the bump is positioned between the second casing and the mating bulged spot, the horizontal limiting means is under separation state (the first stable state). When the bulged spot is positioned between the second casing and the mating bump, the horizontal limiting means is under engaging state (the second stable state).

In still yet another embodiment of the present invention, the insert has a view window mating against the horizontal limiting means that enables a hand tool to apply a force on the horizontal limiting means.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENTS

In the following description for various embodiments, similar parts will be marked by similar numerals to facilitate reading of the description.

Figure 2:
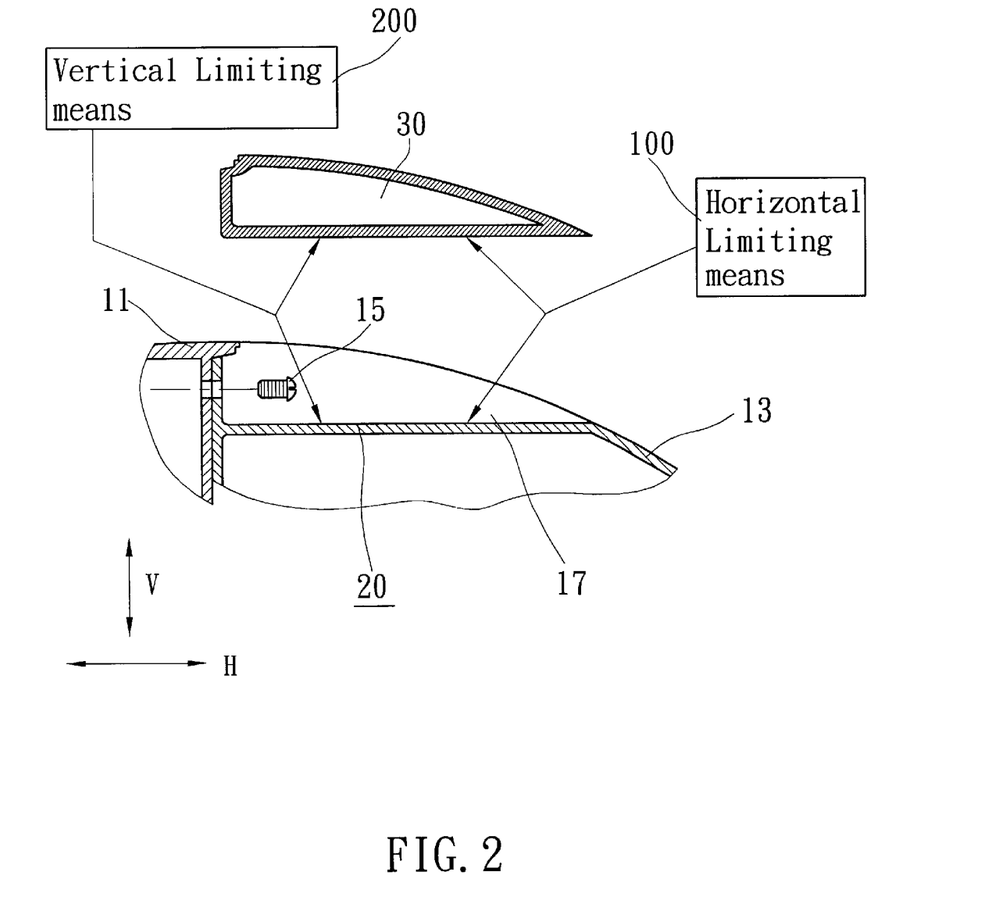
FIG. 2 is, a schematic diagram of the relative position of ornament cap's elements according to the present invention.

Referring firstly to FIG. 2, a schematic diagram of the relative position of ornament cap's elements according to the present invention is shown. The ornament cap according to the present invention is used to cover a screw groove 17 which may be formed in a first casing 13 or in a second casing 11 for accommodating a screw 15 to horizontally fasten (in H direction) the second casing 11 with the first casing 13. FIG. 2 illustrates an example that the groove 17 is located in the first casing 13 and the screw 15 is used to fix the second casing 11 onto the first casing 13. The ornament cap according to the present invention includes a seat 20 located in the screw groove 17 and an insert 30 for engaging with the seat 20 and covering the groove 17. At the engaging interface between the insert 30 and the seat 20, there are a horizontal limiting means 100 in H direction and a vertical limiting means 200 in V direction, as shown in FIG. 2.

The vertical limiting means 200 has a limiting structure for preventing the insert 30 from separating from the groove 17 in a direction perpendicular to the first casing 13 (i.e. V-direction) after the insert 30 has been engaged with the seat 20.

The horizontal limiting means 100 prevents the insert 30 from separating from the groove 17 in a direction parallel to the first casing 13 (i.e., H-direction) after the insert 30 has been engaged with the seat 20.

Figure 11:
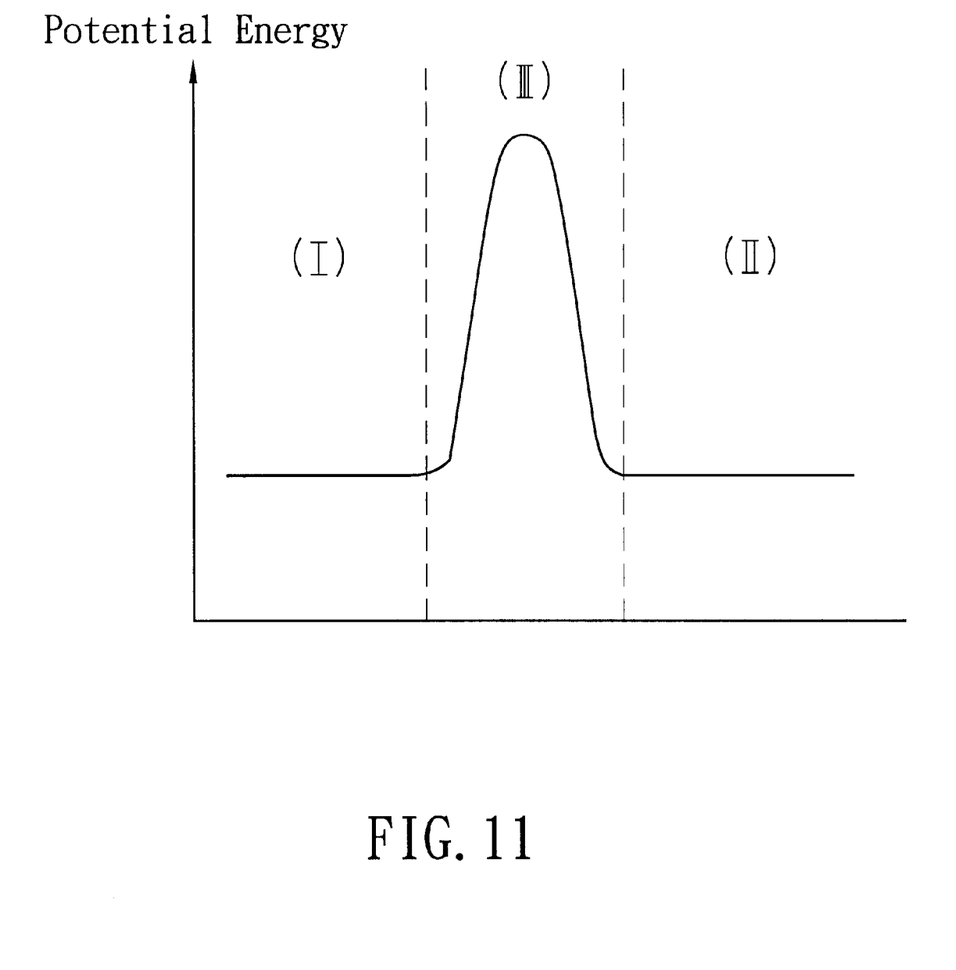
FIG. 11 is a schematic chart showing the potential energy variation against the engagement status of the limiting means according to the present invention.

The horizontal limiting means 100 has two stable states. Referring now to FIG. 11, a schematic chart illustrates the potential energy variation against the engagement status of the horizontal limiting means 100. The first stable state (I) defines the state that the insert 30 is separated from the seat 20. The second stable state (II) defines the state that the inserts 30 is engaged with the seat 20. Both of the first (I) and second (II) stable states are at a low potential energy level. There is a transition state (III) between the first and second stable states that is an unstable state with a higher potential energy level.

According to the present invention, while the insert 30 is being engaged with the seat 20, and while the vertical limiting means 200 is forming a limiting structure, the horizontal limiting means 100 jumps from the first stable state (I) to the second stable state (II) to complete the engagement of the insert 30 with the seat 20. While the insert 30 is being separated from the seat 20, a force is applied to the horizontal limiting means 100 to enable it to jump over the barrier of the transition state (III) from the second state (II) to the first state (I). Another horizontal force is then applied to separate the vertical limiting means 200, and the insert 30 is thus separated from the seat 20. On the basis of the design of the present invention, the stability structure is located in the horizontal limiting means 100. However, it can also be located in the vertical limiting means 200, or be located both in the horizontal and vertical limiting means 100 and 200 at the same time.

Figure 3:
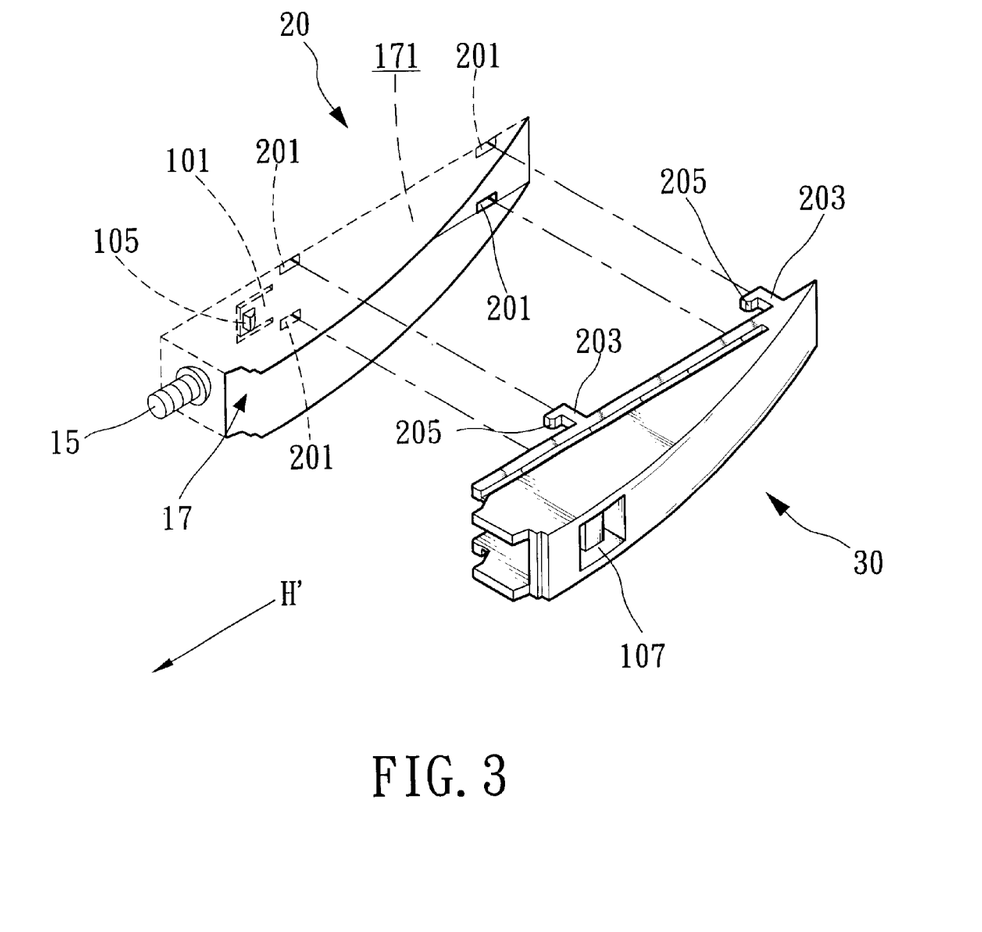
FIG. 3 schematically shows an exploded perspective diagram of the ornament cap according to the first embodiment of the present invention.
Figure 4:
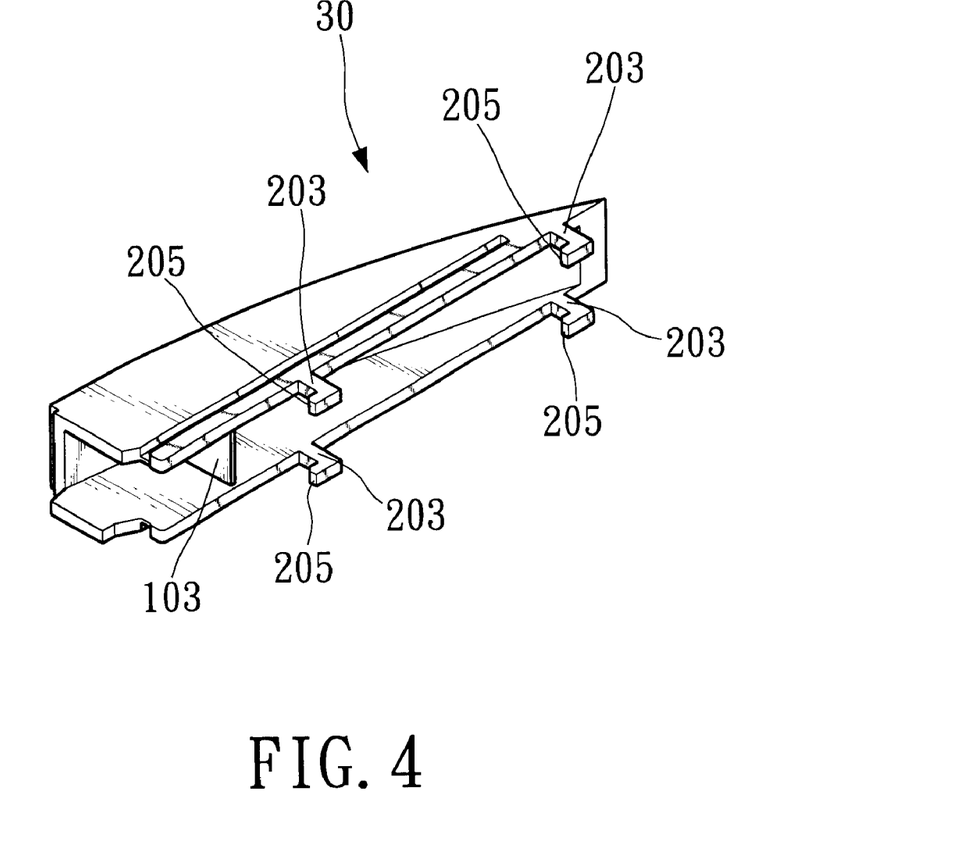
FIG. 4 is another perspective diagram of an insert of this invention shown in FIG. 3.

Please refer now to FIGS. 3 and 4. FIG. 3 shows an exploded perspective diagram of the ornament cap according to the first embodiment of the present invention. FIG. 4 is another perspective diagram of the insert 30 of the present invention shown in FIG. 3. According to the first embodiment, the vertical limiting means includes a plurality of foot holes 201 and the mating latch legs 203 (four pairs of foot holes 201 and the mating latch legs 203 are shown respectively in the figures). The foot holes 201 are formed on the bottom side 171 of the screw groove 17 on the seat 20. Each foot hole, which has selected length and width, passes through the wall of the first casing 13 (see FIG. 2). The latch legs 203 are located on the insert 30 mating with the foot holes 201. Each latch leg has a horizontal foot 205 at one end extending toward the second casing 11 (i.e., in direction H') for engaging with the foot hole 201 passing through the first casing 13 wall. As shown in FIG. 3 and FIG. 4, the horizontal limiting means 100 includes at least one elastic latching member 101 and a mating stopping arm 103 (one set of 101 and 103 are shown in the figures). The elastic latching member 101 is a cantilever-type elastic beam formed in a wall of the first casing 13 located on the bottom side 171 of the groove 17 on the seat 20. The beam has a free end pointing toward the second casing 11 (i.e., the H' direction) and a stopping nose 105 facing the insert 30. The stopping arm 103 is located on the insert 30 and mating with the elastic latching member 101 for forming a horizontal limiting position with the latching member 101 when the insert 30 is being engaged with the seat 20.

Figure 5A:
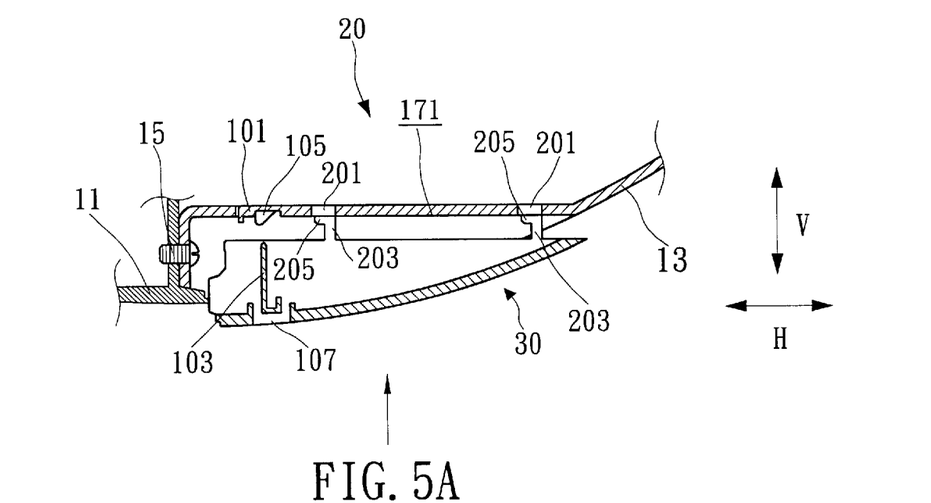
FIG. 5A shows a cross-sectional diagram according to the present invention shown in FIG. 3 before the insert is engaged with the seat.
Figure 5B:
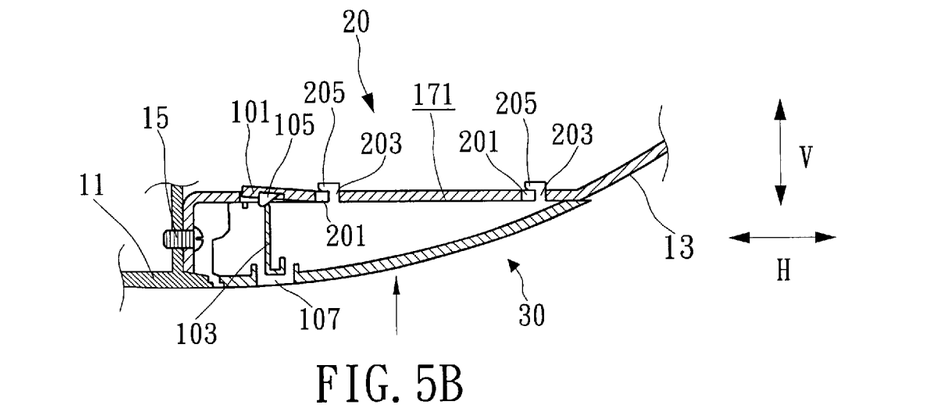
FIG. 5B shows a cross-sectional diagram according to the present invention shown in FIG. 3 during the insert being engaged with the seat.
Figure 5C:
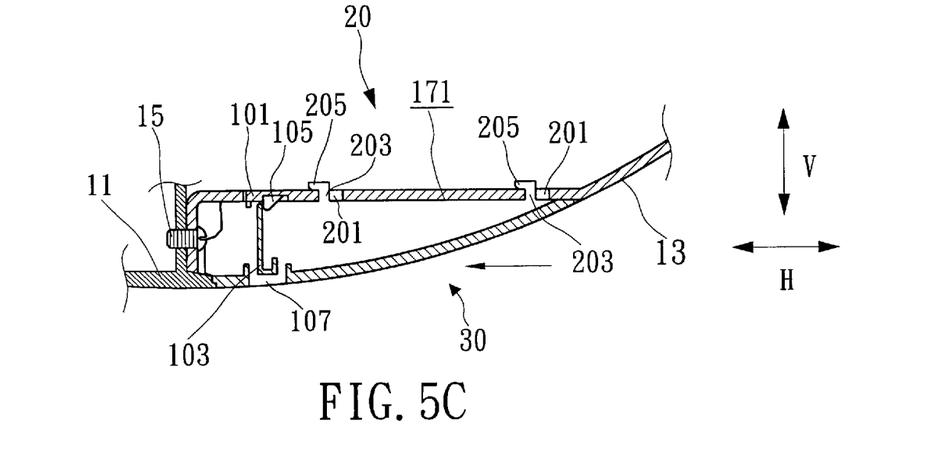
FIG. 5C shows a cross-sectional diagram according to the present invention shown in FIG. 3 after the insert is engaged with the seat.

Referring now to FIG. 5A to FIG. 5C, the schematic diagrams according to the present invention before and after the insert 30 being engaged with the seat 20 are shown respectively. Firstly, FIG. 5A shows the elements' position before the insert 30 is engaged with the seat 20, and at that time the horizontal limiting means is at the first stable state (I). The latch legs 203 of the vertical limiting means are going to enter the foot holes 201. The stopping arm 103 is going to contact with the stopping nose 105 of the horizontal limiting means. Meanwhile, no elastic potential energy is stored.

Referring then to FIG. 5B, the latch legs 203 have passed through the foot holes 201, and the stopping arm 103 of the horizontal limiting means presses against the stopping nose 105 and is located on the far side from the second casing 11 (right side in the figure). Meanwhile, the horizontal limiting means is at the transition state (III). The elastic latching member 101 is being pressed and deformed so as to store a definite elastic potential energy.

Thereafter, the insert 30 is being moved further toward the second casing 11 so that the stopping arm 103 moves over the tip of the stopping nose 105, as shown in FIG. 5C. At that time, the horizontal foot 205 of the latch legs 203 of the vertical limiting means has passed through the foot hole 201 and is located at the rear side of the first casing 13 wall, and forms a vertical limiting position (i.e., in V direction) with the first casing 13 for preventing the ornament cap from separating vertically. According to the horizontal limiting structure, the stopping arm 103 is located at the rear side of the stopping nose 105 facing the second casing 11. Because the elastic latching member 101 has returned to its original position, the stored elastic potential energy in FIG. 5B is then released and the second stable state is achieved. The stopping arm 103 is then blocked by the stopping nose 105. This effectively prevents insert 30 from moving and separating horizontally (in H direction) if no extra force is applied. In the first embodiment set forth above, the stopping nose 105 of the elastic latching member 101 is preferably shaped in a wedge form with a slope surface facing the opposite side of the second casing 11 to facilitate the engaging and disengaging movement with the horizontal limiting means.

According to the first embodiment shown in FIG. 3 to FIG. 5, the insert 30 further contains a view window 107 on it mating with the horizontal limiting means. A force can be applied to the horizontal limiting means by means of a long hand tool through the view window 107. Because the horizontal limiting means and vertical limiting means can fix the insert 30 in the screw groove 17 tightly, the view windows 107 could be used as a hole for suspending other applications after the assembly process is accomplished.

Figure 6:
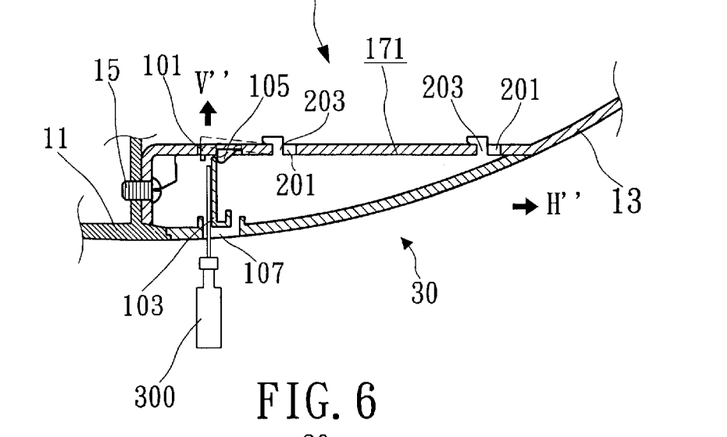
FIG. 6 shows a schematic diagram according to the present invention shown in FIG. 3 for the operation of separating the insert from the seat.

Referring now to FIG. 6, a schematic diagram according to the present invention for the operation of separating the insert 30 from the seat 20 is shown. A hand tool 300 (such as a screw driver as shown in FIG. 6) is used through the view window 107 to press the elastic latching member 101 in V" direction to push the elastic latching member 101 upwards and let the end of the stopping arm 103 lower than the tip of the stopping nose 105. Thereafter, a force is applied to the insert 30 in H" direction, so that the end of the stopping arm 103 passes over the tip of the stopping nose 105 to complete the separation movement of the horizontal limiting means. In the mean time, the foot 205 of the latch legs 203 is moved in the foot hole 201 area by means of pushing the insert 30 in H" direction, and the separation movement of the vertical limiting means may also be accomplished. When both of the horizontal limiting means and the vertical limiting means are separated, the insert 30 is fully disengaged from the seat 20.

During the separation operation mentioned above, work is applied by the hand tool 300, and the plastic potential energy is stored in the elastic latching member 101, so that the horizontal limiting means jumps from the second stable state (II) over the transition state (HII) to the first stable state (I).

In the first embodiment set forth above, the elastic latching member 101 is used to store elastic position energy. In another embodiment (not shown in the figures), the stopping arm 103 can be extended downward like a cantilever so as to be elastic and rigid. In addition, the latching member 101 can also be fixed without the cantilever design. Such a structure can also perform the function of the horizontal limiting means.

Figure 7:
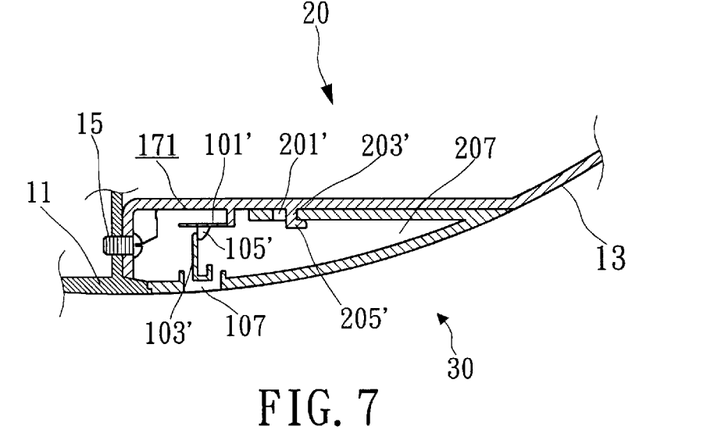
FIG. 7 shows an exploded perspective diagram of the ornament cap according to the second embodiment according to the present invention.

FIG. 7 shows the cross-sectional diagram according to the second embodiment of the present invention. The vertical limiting means includes a plurality of foot holes 201' formed in the insert 30 and mating latch legs 203' located on the seat 20 (one set of foot hole and latch leg are shown in the figure). The foot hole 201' is a through hole with selected length and width and connects to a passage 207 formed in a direction opposite to the second casings 11. The latch leg 203' has a horizontal foot 205' formed at one end thereof extending in a direction opposite to the second casing 11. When the insert 30 is engaged with the seat 20, the latching leg 203' engages with the foot hole 201'. Furthermore, the horizontal foot 205' is engaged with the foot hole 201' and extends into the passage 207 to form a vertical limiting position.

As shown in FIG. 7, according to the second embodiment of the present invention, the horizontal limiting means includes at least one elastic latching member 101' and a mating stopping arm 103' (one set of elastic latching member 101' and stopping arm 103' are shown in the figure). The elastic latching member 101' is located above a bottom surface 171 of the screw groove 17 and is extended horizontally like a cantilever beam toward the second casing 11. It has a stopping nose 105' located at one end facing the insert 30. The stopping arm 103' is located in the insert 30 mating with the elastic latching member 101'. When the insert 30 is engaged with the seat 20, the elastic latching member 101' and the stopping nose 105' form a horizontal limiting position.

On the basis of the second embodiment, the engagement and separation movements, which are similar to the operations shown in the first embodiment, will thus be omitted here.

Figure 8:
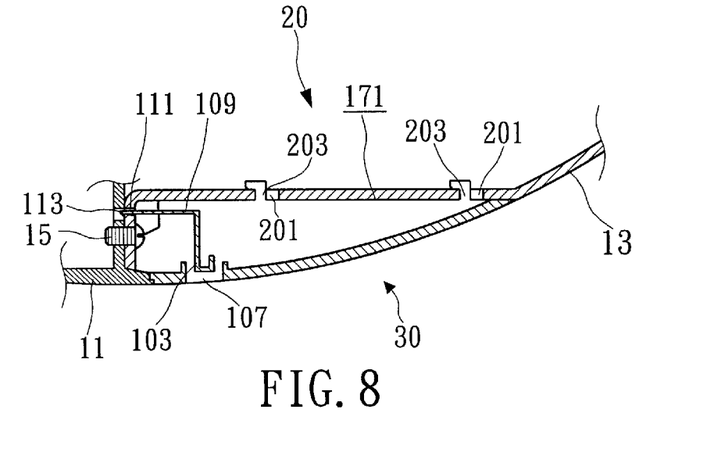
FIG. 8 shows an exploded perspective diagram of the ornament cap according to the third embodiment according to the present invention.

FIG. 8 illustrates the cross-sectional diagram of the ornament cap according to the third embodiment of the present invention. The vertical limiting means is same as the one shown in the first embodiment. The horizontal limiting means includes an elastic arm 109 located in the insert 30 extending toward the second casing 11 and a latch hole 111 located in a wall of the first casing 13. The elastic arm 109 has a hook 13 located at a free end for engaging with the latch hole 111 to form a horizontal limiting position at the second stable state. The insert 30 also has a view window 107 like the one in the first embodiment and serves the same function to facilitate separation of the inert 30 from the screw groove 17. Once the elastic arm 109 is pressed to release the hook 113 from the latch hole 111, the horizontal limiting means jumps from the second stable state to the first stable state.

In the first, second and third embodiments set forth above, the vertical and horizontal limiting means have distinctive structures and may bear heavy force after the engagement operation is performed. Therefore, the insert 30 may be made for other useful features by shaping its outside form, such as a hanger or a rack. In addition, the view window 107 can also be used for other applications. However, if there is no other applications for the insert 30, the vertical and horizontal limiting means can be made smaller and simpler. The following embodiments further show the possible designs for such purposes.

Figure 9:
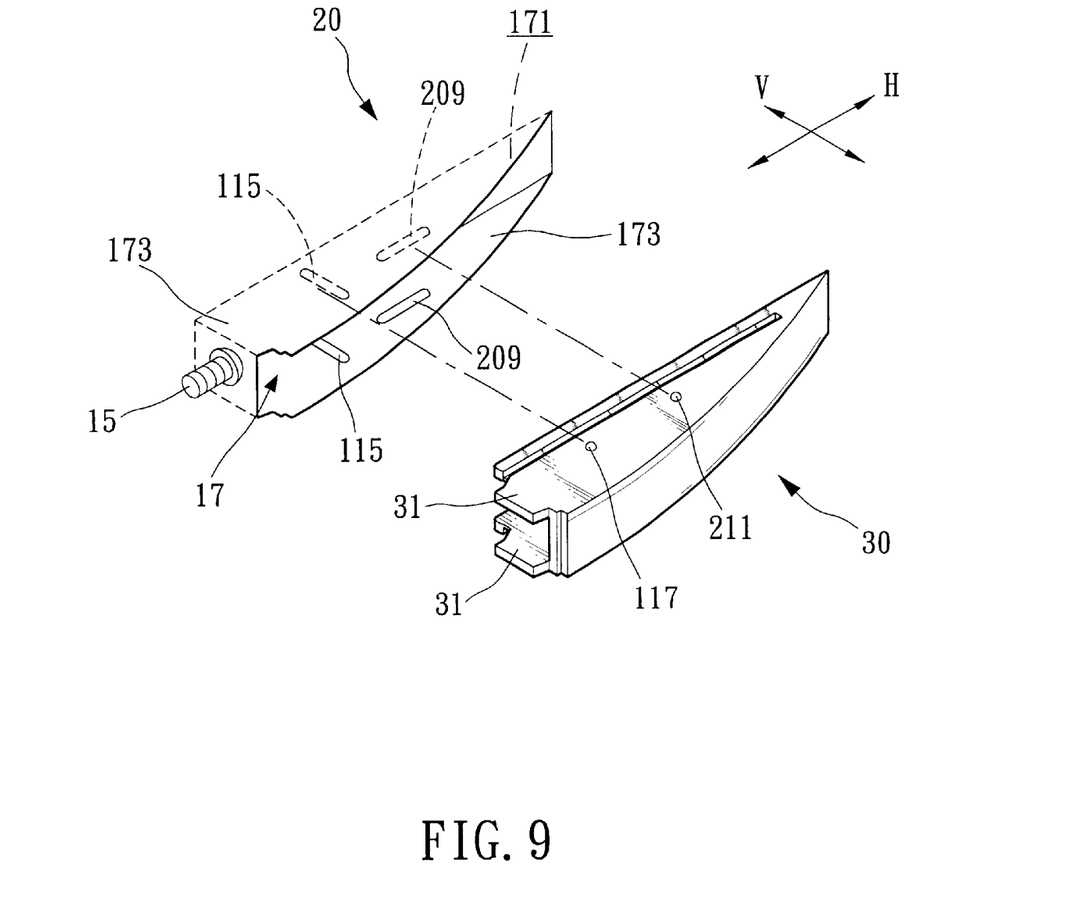
FIG. 9 shows an exploded perspective diagram of the ornament cap according to the fourth embodiment of the present invention.

FIG. 9 shows an exploded perspective diagram of the ornament cap according to the fourth embodiment of the present invention. The screw groove 17 has at least one side wall 173 (two side walls 173 are shown in the figure). The insert 30 has a mating side wing 31 with the side wall 173. The vertical and horizontal limiting means are located on the mating side wall 173 and side wing 31. The vertical limiting means includes at least one first bump 209 formed thereon parallel with a wall of the first casing (in direction H) on the side wall 173 and a first bulged spots 211 formed on the side wing 31 mating with the bump 209. The side wing 31 has at least one first bulged spot 211 formed thereon mating with the first bump 209 (the figure shows respectively two such bumps 209 and bulged spots 211). Through the first bump 209 and the first bulged spot 211, vertical limiting function can be achieved. When the first bump 209 is positioned between the bottom surface 171 of the groove 17 and the mating first bulged spot 211, the vertical limiting means is at a separating state. When the first bulged spot 211 is positioned between the bottom surface 171 and the first bump 209, the vertical limiting means is at an engagement state.

FIG. 9 also illustrates a horizontal limiting means which includes at least one second bump 115 located on the side wall 173 perpendicular to the wall of the first casing 13 (in direction V), and a second bulged spot 117 formed on the side wing 31 of the insert 30. When the second bump 115 is positioned between the second casing 11 (about at the position of screw 15) and the mating second bulged spot 117, the horizontal limiting means is at a separation state. When the second bulged spot 117 is positioned between the second casing 11 (also around the screw 15) and the mating second bump 115, the horizontal limiting means is at an engagement state.

Figure 10A:
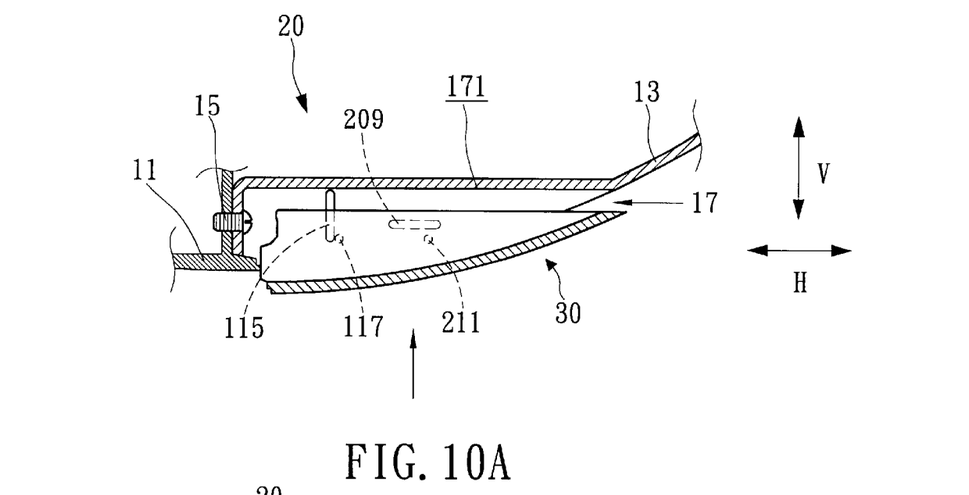
FIG. 10A shows a cross-sectional diagram according to the present invention shown in FIG. 9 before the insert is engaged with the seat.
Figure 10B:
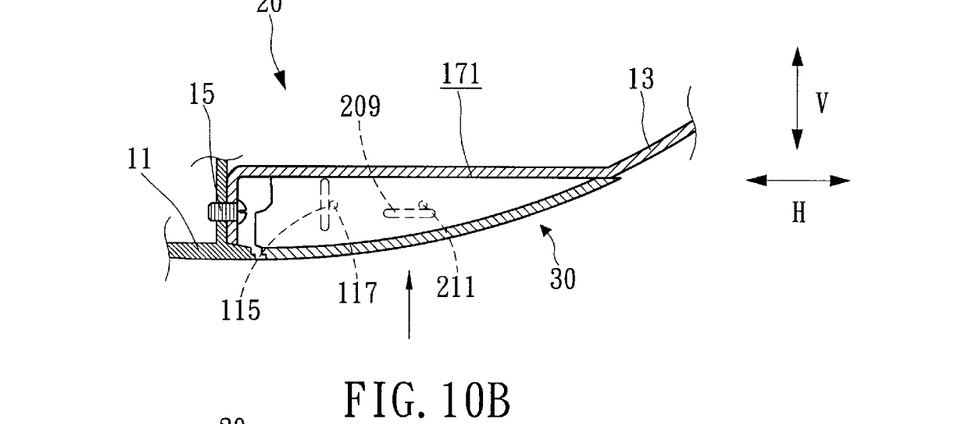
FIG. 10B shows a cross-sectional diagram according to the present invention shown in FIG. 9 during the insert being engaged with the seat.
Figure 10C:
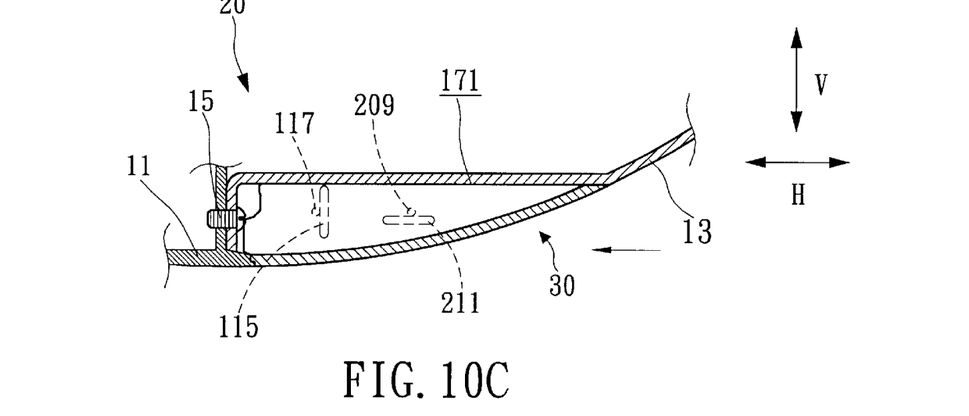
FIG. 10C shows a cross-sectional diagram according to the present invention shown in FIG. 9 after the insert is engaged with the seat.

FIGS. 10A, 10B and 10C respectively show the relative positions of the insert 30 and the seat 20 before, during, and after the engagement operation according to the fourth embodiment of the present invention. FIG. 10A shows the separation state before the insert 30 engaging with the seat 20. The first bump 209 is located between the bottom surface 171 of the screw groove 17 and the first bulged spot 211. The second bump 115 is located between the second casing 11 and the second bulged spot 117.

FIG. 10B shows that the insert 30 is moved vertically toward the bottom of the screw groove 17 in order to let the first bulged spot 211 pass over the first bump 209 of the seat 20 to form a vertical limiting position.

After that, the insert 30 is moved horizontally toward the second casing 11 in order to let the second bulged spot 117 pass over the second bump 115 to become the state shown in FIG. 10C. It thus reaches a horizontal limiting position in a direction of H. Hence the ornament cover can be prevented from disengaging from the groove 17 when there is no external force applied.

As the engagement force by the bulged spot and bump shown in the fourth embodiment is relatively limited, using a hand tool to wedge into the gap between the insert and the groove may disengage the insert from the groove. Of course the insert 30 may also have a view window like the one shown in FIG. 3 for the disengagement operation.

While the fourth embodiment set forth above has the horizontal limiting means located between the side wall 173 and side wing 31, it may function equally well to have the horizontal limiting means located between the bottom 171 and the bottom of the insert 30. Some modifications of the apparatus on the basis of this embodiment will not depart from the scope of the present invention.

Another variation in the fourth embodiment is to exchange the locations of the bump and bulged spot. Some modifications of the apparatus on the basis of this embodiment will not depart from the scope of the present invention.

It may thus be seen that the objects of the present invention set forth above, as well as those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An ornament cap for covering a groove formed in a first casing which is fastened to a second casing, comprising:
   a seat on a bottom of said groove including a foot hole formed in a wall of said first casing and a elastic latching member spaced from said foot hole; and
   an insert for engaging with said seat and for covering said groove, including:
      a latch leg with a transverse foot extending toward said second casing for passing through said foot hole;
      a stopping arm for mating with said elastic latching member to reach a limiting position with said seat; and
      a window for accessing said elastic latching member when said insert is engaged with said seat;
   wherein for engaging said insert with said seat, said latch leg passes through said foot hole, said insert is moved transversely in order that said transverse foot engages with the wall of said first casing to reach a vertical limiting position and said stopping arm engages with said elastic latching member to reach a horizontal limiting position; for separating said insert from said seat, a hand tool is used to pass through said window to press against said elastic latching member for separating the stopping arm from said elastic latching member, then said insert is pulled away from said second casing to let said transverse foot be held within said foot hole for disengaging said latch leg from said foot hole to complete the separation.

2. The ornament cap of claim 1, wherein said elastic latching member is an elastic cantilever beam formed on a wall of said first casing with a free end facing said second casing and a stopping nose facing said insert, wherein said stopping arm locates at the far side of the stopping nose from said second casing before said insert is engaged with said seat; said stopping arm locates at another side of said stopping nose facing said second casing after said insert is engaged with said seat.

3. The ornament cap of claim 2, wherein said stopping nose is wedge-shaped with a sloped surface facing the opposite side of said second casing.

4. The ornament cap of claim 1, wherein said elastic latching member is an elastic transverse cantilever beam formed in a bottom wall of said groove extending toward said second casing, having a free end with a stopping nose facing the insert, wherein said stopping arm locates at the far side of the stopping nose from said second casing before said insert is engaged with said seat; said stopping arm locates at another side of said stopping nose facing said second casing after said insert is engaged with said seat.

5. The ornament cap of claim 4, wherein said stopping nose is wedge-shaped with a sloped surface facing the opposite side of said second casing.

6. An ornament cap for covering a groove formed in a first casing which is fastened with a second casing, comprising a seat located in said groove and an insert for engaging with said seat and for covering said groove, wherein an engaging interface between said insert and said seat comprises:
   a vertical limiting means to reach a limiting position for preventing said insert from separating form said groove along a direction perpendicular to a wall of said first casing; and
   a horizontal limiting means for preventing said insert from separating from said groove along a direction parallel to said wall of first casing, wherein said horizontal limiting means has two elastic stable levels which include a first stable level defined for a state in which said insert separates from said seat and a second stable level defined for another state in which said insert is engaged with said seat;
   wherein for engaging said insert with said seat, said vertical limiting means is reaching said limiting position; meanwhile, said horizontal limiting means jumps from said first stable level to said second stable level to complete the engagement; for separating said insert from said seat, after a first force is applied to said horizontal limiting means, said horizontal limiting means jumps from said second stable state to said first stable state and a second transverse force is applied to said vertical limiting means to complete the separation.

7. The ornament cap of claim 6, wherein said vertical limiting means includes a plurality of foot holes and mating latch legs, wherein said foot holes with selected length and width are formed in said seat and pass through said wall of first casing; said latch legs are located in said insert with individual transverse feet extending toward said second casing for engaging with the said wall of first casing through said foot hole.

8. The ornament cap of claim 6, wherein said vertical limiting means includes a plurality of foot holes and mating latch legs, wherein said foot holes with selected length and width are through holes formed in said insert and connect to a passage formed in said insert extending in a direction opposite to said second casing; said latch legs are located in said seat with individual transverse feet extending toward a direction opposite to said second casing for engaging with said passage through said foot hole.

9. The ornament cap of claim 6, wherein said horizontal limiting means includes an elastic latching member and a mating stopping arm, wherein said elastic latching member is an elastic cantilever beam formed in said seat with a free end facing said second casing and has a stopping nose facing said insert; said stopping arm is located in said insert to form a horizontal limiting position with said elastic latching member in order that said insert engages with said seat; said stopping arm locates at the far side of said stopping nose from said second casing before said insert is engaged with said seat; said stopping arm locates at another side of said stopping nose facing said second casing after said insert is engaged with said seat.

10. The ornament cover of claim 9, wherein said stopping nose is wedge-shaped with a sloped surface facing the opposite side of said second casing.

11. The ornament cap of claim 6, wherein said horizontal limiting means includes elastic latching member and a mating stopping arm, wherein said elastic latching member is an cantilever beam formed in a bottom of the groove with a free end facing said second casing and has a stopping nose facing the insert; said stopping arm is located in said insert to form a horizontal limiting position with said elastic latching member in order that said insert engages with said seat; said stopping arm locates at the far side of said stopping nose from said second casing before said insert is engaged with said seat; said stopping arm locates at another side of said stopping nose facing said second casing after said insert is engaged with said seat.

12. The ornament cover of claim 11, wherein said stopping nose is wedge-shaped with a sloped surface facing the opposite side of said second casing.

13. The ornament cap of claim 6, wherein said horizontal limiting means includes an elastic arm extending toward said second casing and a latch hole formed in said first casing, wherein said elastic arm has a stopping hook formed at one end thereof for engaging with said first casing through said latch hole for engaging said insert with said seat.

14. The ornament cap of claim 6, wherein said insert has a window mating with said horizontal limiting means for applying a force by hand tool to said horizontal limiting means.

15. The ornament cap of claim 6, wherein said horizontal limiting means includes a bump formed on said seat and perpendicular to said first casing and a bulge spot formed on said insert mating with said bump; wherein said horizontal limiting means is at said first stable state when the bump is positioned between said second casing and said mating bulged spot; said horizontal limiting means is at said second stable state when said bulged spot is positioned between said second casing and said mating bump.

16. The ornament cap of claim 6, wherein said horizontal limiting means includes a bump formed on said insert and perpendicular to said first casing and a bulge spot formed on said seat mating with said bump; wherein said horizontal limiting means is at said first stable state when said bump is positioned between said second casing and said mating bulged spot; said horizontal limiting means is at said second stable state when said bulged spot is positioned between said second casing and said mating bump.

17. The ornament cap of claim 6, wherein said groove includes a bottom surface and a side wall, said insert includes a side wing, said vertical limiting means includes a bump formed on said side wall parallel to said wall of first casing and a bulged spot formed on said side wing mating with said bump; wherein said vertical limiting means is at engaging state when said bump is positioned between said bottom surface and said bulged spot, said vertical limiting means is at separating state when said bulged spot is positioned between said bottom surface and said bump.

18. The ornament cap of claim 6, wherein said groove includes a bottom surface and a side wall, said insert includes a side wing, said vertical limiting means includes a bulged spot formed on said side wall parallel to said wall of first casing and a bump formed on said side wing mating with said bulged spot; wherein said vertical limiting means is at engaging state when said bump is positioned between said bottom surface and said bulged spot, said vertical limiting means is at separating state when said bulged spot is positioned between said bottom surface and said bump.

* * * * *